US012593457B2

(12) United States Patent
Frougier et al.

(10) Patent No.: US 12,593,457 B2
(45) Date of Patent: Mar. 31, 2026

(54) MULTI-STATE FERROELECTRIC-RAM WITH STACKED CAPACITORS

(71) Applicant: INTERNATIONAL BUSINESS MACHINES CORPORATION, Armonk, NY (US)

(72) Inventors: Julien Frougier, Albany, NY (US); Kangguo Cheng, Schenectady, NY (US); Ruilong Xie, Niskayuna, NY (US); Chanro Park, Clifton Park, NY (US); Min Gyu Sung, Latham, NY (US)

(73) Assignee: International Business Machines Corporation, Armonk, NY (US)

( * ) Notice: Subject to any disclaimer, the term of this patent is extended or adjusted under 35 U.S.C. 154(b) by 674 days.

(21) Appl. No.: 17/938,667

(22) Filed: Oct. 6, 2022

(65) Prior Publication Data

US 2024/0121966 A1 Apr. 11, 2024

(51) Int. Cl.
*H01L 27/11507* (2017.01)
*H10B 53/30* (2023.01)
*H10D 62/10* (2025.01)

(52) U.S. Cl.
CPC ............ *H10B 53/30* (2023.02); *H10D 62/10* (2025.01)

(58) Field of Classification Search
CPC ........ H10B 53/00; H10B 53/30; H10B 63/84; H10B 63/845; H10D 62/10
See application file for complete search history.

(56) References Cited

U.S. PATENT DOCUMENTS

| | | | |
|---|---|---|---|
| 5,495,117 | A | 2/1996 | Larson |
| 6,704,219 | B2 | 3/2004 | Bruchhaus et al. |
| 6,744,093 | B2 | 6/2004 | Agarwal et al. |
| 6,852,240 | B2 | 2/2005 | Hartner et al. |
| 9,219,225 | B2 | 12/2015 | Karda et al. |

(Continued)

FOREIGN PATENT DOCUMENTS

| | | |
|---|---|---|
| CN | 112470277 A | 3/2021 |
| CN | 119999353 A | 5/2025 |

(Continued)

OTHER PUBLICATIONS

International Search Report and Written Opinion issued Oct. 19, 2023 in related application No. PCT/CN2023/107828, 7 pgs.

(Continued)

*Primary Examiner* — Ermias T Woldegeorgis
(74) *Attorney, Agent, or Firm* — CHIP LAW GROUP

(57) ABSTRACT

A memory device includes a substrate and vertically stacked ferroelectric capacitors formed on the substrate. A first ferroelectric capacitor has a different capacitive output than a second ferroelectric capacitor when a constant voltage is applied. First and second electrodes are in electrical contact with the vertically stacked ferroelectric capacitors. In some instances, a first capacitor plate in the first ferroelectric capacitor and a second capacitor plate in the second ferroelectric capacitor have different thicknesses. The different thicknesses allow the capacitive output for each capacitor to produce different electric field outputs. Accordingly, a combination of different output signals can be produced based on different threshold voltage levels for each capacitor contributing to the output.

16 Claims, 17 Drawing Sheets

(56) References Cited

U.S. PATENT DOCUMENTS

| | | | |
|---|---|---|---|
| 10,403,631 B1 | 9/2019 | Lu et al. | |
| 10,453,514 B2 | 10/2019 | Yoo | |
| 10,566,043 B2 | 2/2020 | Kawamura | |
| 2019/0148286 A1 | 5/2019 | Or-Bach et al. | |
| 2020/0295017 A1 | 9/2020 | Frougier et al. | |
| 2021/0210496 A1 * | 7/2021 | Chia | H10D 30/701 |
| 2021/0375888 A1 | 12/2021 | Lu et al. | |

FOREIGN PATENT DOCUMENTS

| | | | |
|---|---|---|---|
| DE | 112023004210 | T5 | 8/2025 |
| GB | 2638615 | A | 8/2025 |
| KR | 100963132 | B1 | 6/2010 |
| WO | 2024/074073 | A1 | 4/2024 |

OTHER PUBLICATIONS

"FRAM MCU Key Strengths and Applications", Fujitsu, 2010, 9 pages.

* cited by examiner

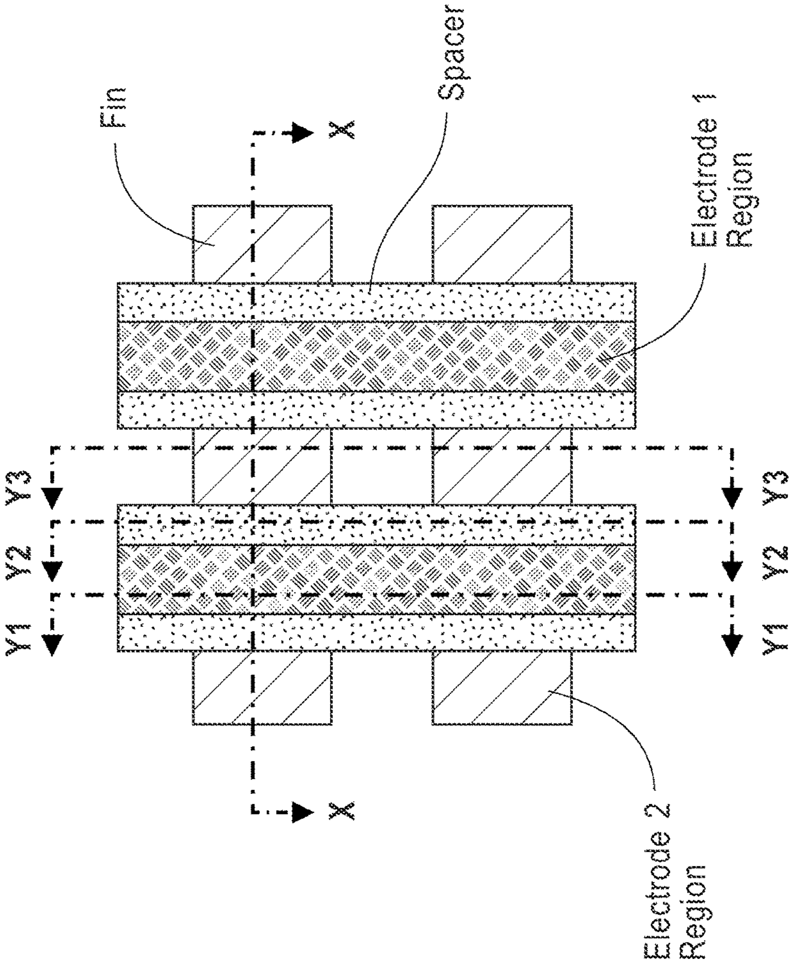
FIG. 3
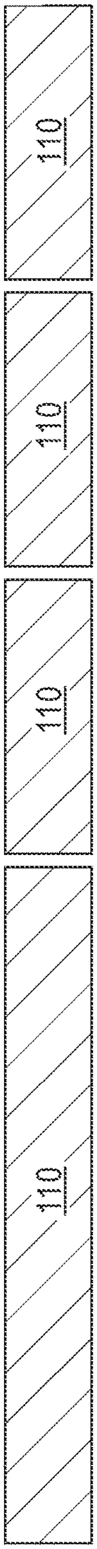
X - Cross-Gate over Fin
FIG. 4A
Y1 - Cross-Fin
Electrode 1
FIG. 4B
Y2 - Cross-Fin
Spacer
FIG. 4C
Y3 - Cross-Fin
Electrode 2
FIG. 4D

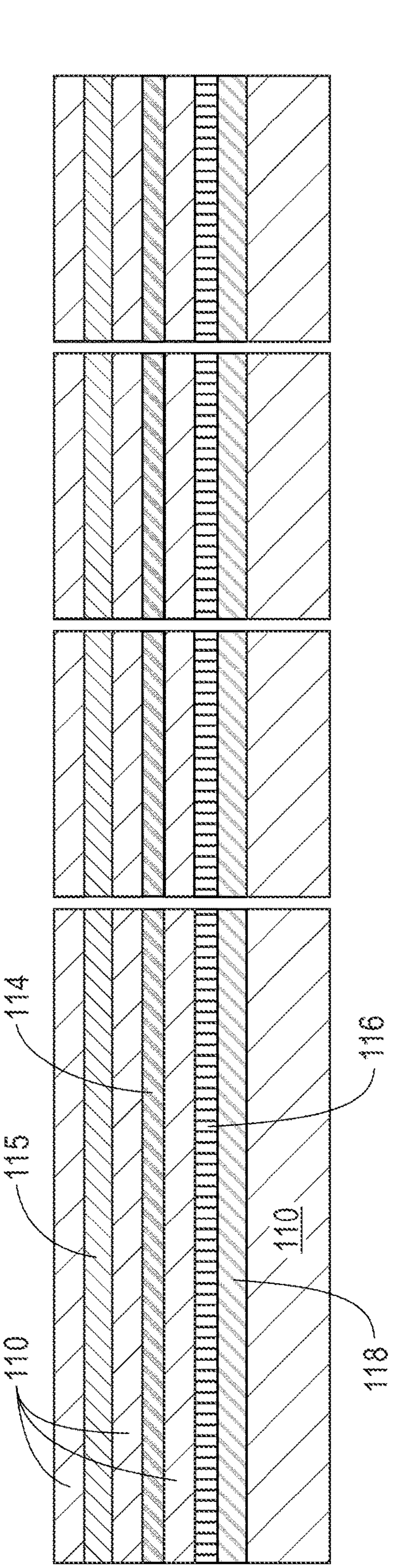
FIG. 5A
FIG. 5B
FIG. 5C
FIG. 5D
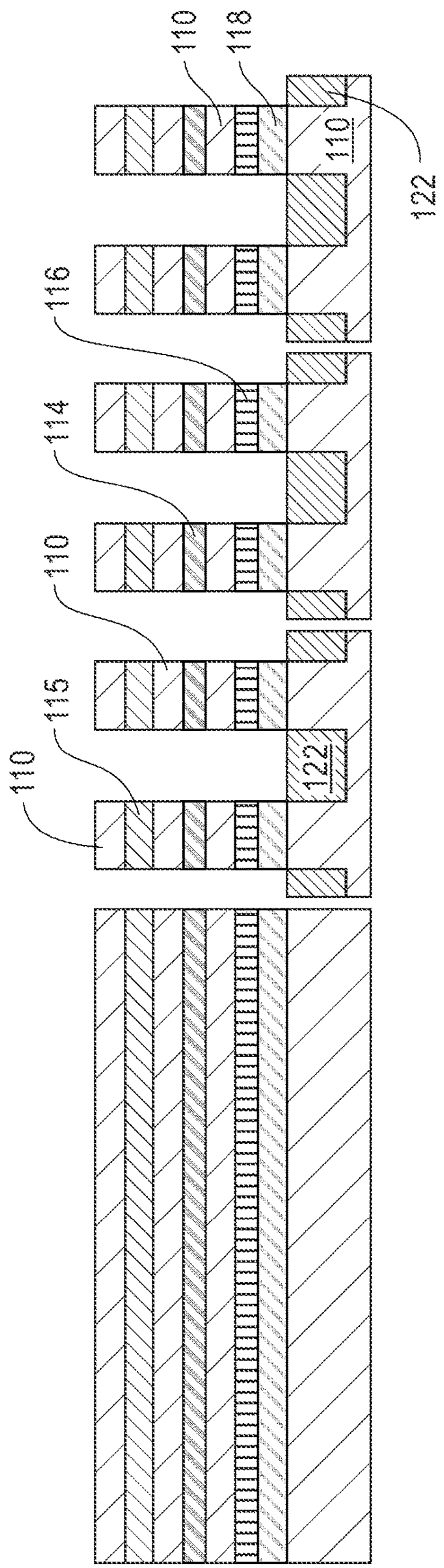
FIG. 6A
FIG. 6B
FIG. 6C
FIG. 6D

MULTI-STATE FERROELECTRIC-RAM WITH STACKED CAPACITORS

BACKGROUND

Technical Field

The present disclosure generally relates to electrical devices, and more particularly, to a multi-state ferroelectric-RAM device with stacked capacitors.

Description of the Related Art

Ferroelectric RAM (FRAM) is a random-access memory similar in construction to DRAM but uses a ferroelectric layer instead of a dielectric layer. FRAM generally use two terminals with an intermediary element. For example, a common FRAM includes a top electrode, a bottom electrode, and a ferroelectric film positioned between the electrodes that are arranged vertically. Information in the device is generally stored in the ferroelectric film. The output from the ferroelectric material may be coded based on the property of the ferroelectric film used.

SUMMARY

According to an embodiment of the present disclosure, a memory device is provided. The memory device includes a substrate. Vertically stacked ferroelectric capacitors are formed on the substrate. A first ferroelectric capacitor has a different capacitive output than a second ferroelectric capacitor when a constant voltage is applied. First and second electrodes are in electrical contact with the vertically stacked ferroelectric capacitors.

In an embodiment, a first capacitor plate in the first ferroelectric capacitor and a second capacitor plate in the second ferroelectric capacitor have different thicknesses. As may be appreciated. The different thicknesses allow the capacitive output for each capacitor to produce different electric field outputs. Accordingly, a combination of different output signals can be produced based on different threshold voltage levels for each capacitor contributing to the output.

According to an embodiment of the present disclosure, a programmable memory device is provided. The memory device includes a plurality of ferroelectric capacitor plate pairs stacked in layers. A thickness of a first capacitor plate varies from a thickness of a second capacitor plate. Isolation layers are positioned between the stacked ferroelectric capacitor plate pairs. A first and second electrode is in contact with the ferroelectric capacitor plate pairs. As may be appreciated, stacking.

In an embodiment, consistent with preceding embodiments, the first electrode is wrapped around the dielectric mandrel and is in contact with a first surface of the plurality of ferroelectric capacitor plate pairs. The second electrode is in contact with a second surface of the plurality of ferroelectric capacitor plate pairs. As may be appreciated, by forming electrode contacts as described, multiple memory cell units maybe formed adjacent one another because the second electrode may be shared between two memory cells. More programmable devices can thus occupy a smaller footprint on a chip.

According to an embodiment, a method of manufacture includes forming a stack of sheets on a substrate. The stack includes alternating layers of a first material and suspension layers of a second material. A plurality of fin structures are formed on the stack of sheets. A shallow trench isolation structure is formed between the fin structures and into the stack of sheets. A dummy electrode placeholder is formed. The sheets of the first material are removed. A dielectric mandrel is formed in areas of the removed first material. The suspension layers are indented to form capacitor cavities. Each layer is indented inward a different amount. The capacitor cavities are filled with a ferroelectric material. The ferroelectric material, at each level of the dielectric mandrel, has a different thickness. The dummy electrode placeholder and the suspension layers are selectively removed, leaving empty spaces. A first electrode is formed in the empty spaces. The first electrode is in contact with a first surface of the ferroelectric material at each level of the dielectric mandrel. A second electrode is formed external to the dielectric mandrel. The second electrode is in contact with a second surface of the ferroelectric material at each level of the dielectric mandrel.

In an embodiment, consistent with preceding embodiments, the method further includes forming an isolation layer positioned on top of the substrate and under the plurality of vertically stacked ferroelectric capacitors. The isolation layer prevents parasitic leakage between electrodes through the substrate which may cause a short.

In general, it should be further appreciated that the embodiments above provide a device that provides multiple storage states for programming, and in some embodiments, more than the two storage states of binary devices (0 and 1 states). In this sense, the device is a multi-state memory device. While the embodiment below illustrates a case of multi-state memories possible with three capacitors per cell, it will be understood that additional layers of capacitors may be included that increases the potential combinations of output for programming beyond what is discussed in the example below. Accordingly, devices of the subject technology may be generated ranging from one capacitor to n capacitors (n being an integer) that increases the number of states available for programming. In addition, the use of a ferroelectric based capacitor makes the device non-volatile which is useful in speeding up the start of a computing device. A ferroelectric capacitor is also power consumption efficient and easier to program.

The techniques described herein may be implemented in a number of ways. Example implementations are provided below with reference to the following figures.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

FIG. 3 is a legend showing axes of perspective for the views in FIGS. 4A/4B/4C/4D-19A/19B/19C/19D, consistent with embodiments of the present disclosure.

FIGS. 4A-4D are cross-sectional views of a substrate in the initial portion of a process for manufacturing a ferroelectric memory device according to an embodiment.

FIGS. 5A-5D show views of formation of an epitaxial growth of placeholder and suspension layers according to an embodiment.

FIGS. 6A-6D show views forming fins for a multi-state device structure, according to an embodiment.

FIGS. 11A-111D show views of selectively removing dielectric placeholder layers, according to an embodiment.

DETAILED DESCRIPTION

Overview

Figure 1:
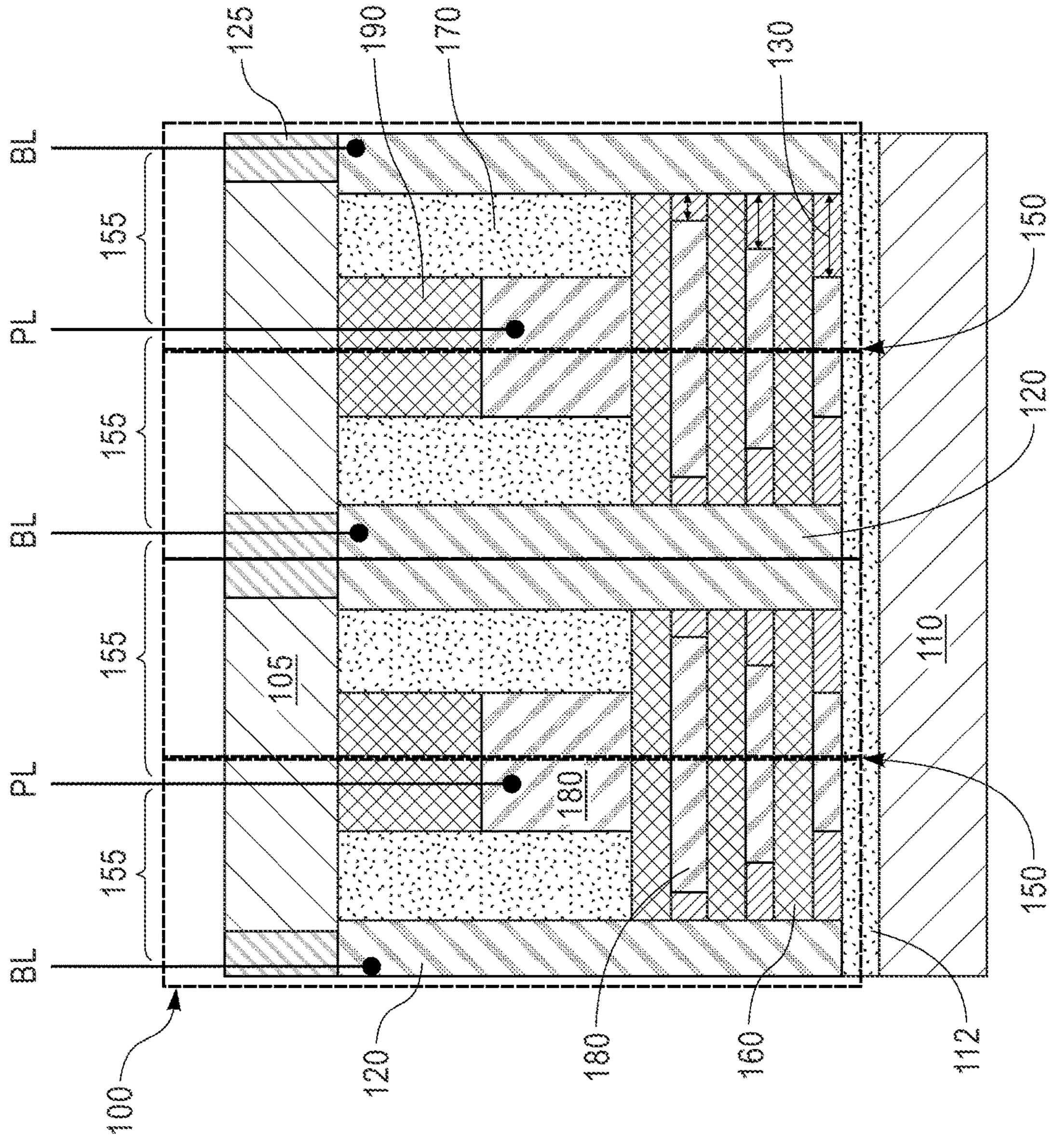
FIG. 1 is a diagrammatic of a cross-sectional view of a ferroelectric memory device according to an embodiment of the present disclosure.

In general, embodiments in the disclosure provide a stacked, multi-state ferroelectric-RAM device. The device uses vertically stacked capacitors with plates of different thicknesses. The different plate thicknesses allow one to design different states of output from the device allowing increased flexibility in the programming available compared to conventional binary memories.

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

In one aspect, spatially related terminology such as "front," "back," "top," "bottom," "beneath," "below," "lower," above," "upper," "side," "left," "right," and the like, is used with reference to the direction of the Figures being described. Since components of embodiments of the disclosure can be positioned in a number of different directions, the directional terminology is used for purposes of illustration and is in no way limiting. Thus, it will be understood that the spatially relative terminology is intended to encompass different directions of the device in use or operation in addition to the direction depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other directions) and the spatially relative descriptors used herein should be interpreted accordingly.

As used herein, the terms "lateral", "planar", and "horizontal" describe an orientation parallel to a first surface of a chip or substrate. In the disclosure herein, the "first surface" may be the top layer of a semiconductor device where individual circuit devices are patterned in the semiconductor material.

As used herein, the term "vertical" describes an orientation that is arranged perpendicular to the first surface of a chip, chip carrier, chip substrate, or semiconductor body.

As used herein, the terms "coupled" and/or "electrically coupled" are not meant to mean that the elements must be directly coupled together-intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together.

Although the terms first, second, etc., may be used herein to describe various elements, these elements should not be limited by these terms. These terms are only used to distinguish one element from another. For example, a first element could be termed a second element, and, similarly, a second element could be termed a first element, without departing from the scope of example embodiments. Nor does describing an element as "first" or "second", etc. necessarily mean that there is an order or priority to any of the elements. As used herein, the term "and/or" includes any and all combinations of one or more of the associated listed items.

Example embodiments are described herein with reference to cross-sectional illustrations that are schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope. It should be appreciated that the figures and/or drawings accompanying this disclosure are exemplary, non-limiting, and not necessarily drawn to scale.

It is to be understood that other embodiments may be used, and structural or logical changes may be made without departing from the spirit and scope defined by the claims. The description of the embodiments is not limiting. In particular, elements of the embodiments described hereinafter may be combined with elements of different embodiments.

Device Structure

FIG. 1 shows a stacked, multi-state ferroelectric-RAM device 100 (sometimes referred to generally as the "device 100"). The device 100 is a multi-state type of memory device. In general, the device 100 includes stacked levels of electrodes 180 and ferroelectric capacitor plates 130 (sometimes referred to generally as "capacitors 130"). The device 100 includes multiple FRAM units 150 (whose process for manufacture are described below in FIGS. 3 through 19A-19D). A memory cell 155 is formed from an electrode 180 to an adjacent electrode 120. As can be seen from FIG. 1, an electrode 180 may be shared by two adjacent electrodes 120. Each memory cell 155 may have three ferroelectric layers (a ferroelectric layer includes capacitors 130 and electrodes 180). As will be understood, some embodiments may include less layers or more layers than shown. Depending on how voltage is applied between an electrode 180 and electrode 120, one will selectively polarize the first, second, or third ferroelectric layer.

Other features shown in FIG. 1 that will be discussed in the manufacture of the device 100 below, may include, for example, a substrate 110, a dielectric 105 on the top of the device, an isolation layer 112 that isolates the memory cells 155 from the substrate 110 (and from any structures below the substrate 110) (also eliminates risk of parasitic leakage between electrodes 120 and 180 through the substrate 110), a metal contact 125 that connects the electrodes 120 to middle of line connections, dielectric mandrel layers 160 that isolates the ferroelectric layers from each other, a spacer 170 that isolates the electrodes 120 from the electrode 180, and a cap 190 that protects the electrode 180 in the first electrode region of the device.

Referring now to FIGS. 2A-2D, partial views of FRAM units 150 from FIG. 1 are shown in different states. Each ferroelectric layer includes capacitor plates 130 of different horizontal thickness (or width). The thickness of the plate affects the ferroelectric field output from the capacitor 130. Upon the application of an electric field to the layer, a spontaneous electric polarization inherently develops in the crystal structure of the ferroelectric material. The ferroelectric layer may exhibit two stable polarization states with hysteresis behavior. A given ferroelectric material exhibits a given electric field threshold which, when exceeded, causes polarization reversal in the field. Furthermore, the polarization does not disappear even when the electric field is removed. Electric fields generated by applying voltages between the two electrodes of the memory cell are used as to program the device. The electric field E for a capacitor is governed by Eq. 1:

$$\overrightarrow{E_x} = \frac{\overrightarrow{V_{applied}}}{d_x} \qquad \text{Eq. 1}$$

At constant voltage, for a capacitor medium of thickness d:

for $d_1<d_2<d_3$, then $\overrightarrow{E_1}>\overrightarrow{E_2}>\overrightarrow{E_3}$. Referring temporarily back to FIG. 1, the thickness d is based on the distance in the horizontal direction for an individual capacitor 130's ferroelectric material section or medium (for example, as depicted by the span of arrows shown in each capacitor 130).

Per the above, assuming a constant voltage is applied, as the thickness of capacitors gets lower from the bottom ferroelectric layer to the top ferroelectric layer, the resultant applied electric field in the ferroelectric capacitor increases. FIGS. 2A-2D show capacitors 130*a*, 130*b*, and 130*c*. Capacitor 130*a* (the topmost capacitor) has the shortest thickness d. Capacitor 130*b* (the capacitor in the middle position) having a thickness d larger than the thickness of capacitor 130*a*, but thinner than the thickness of capacitor 130*c* (the bottom capacitor). During programming of a given memory cell 155 (FIG. 1), the capacitors experiencing an applied electric field above the threshold electric field of the ferroelectric material will undergo polarization reversal. The information for programming may be encoded in the capacitors, which retain information when in the polarization reversal state. However, the capacitors experiencing an applied electric field below the threshold electric field of the ferroelectric material will not undergo polarization reversal. The information will not be retained in these capacitors. Therefore, it is possible to selectively program individual capacitors within a given memory cell through incremental increase of the applied voltage between the first and second electrode leading to a multi-state memory cell.

Figures 2A, 2B, 2C, 2D:
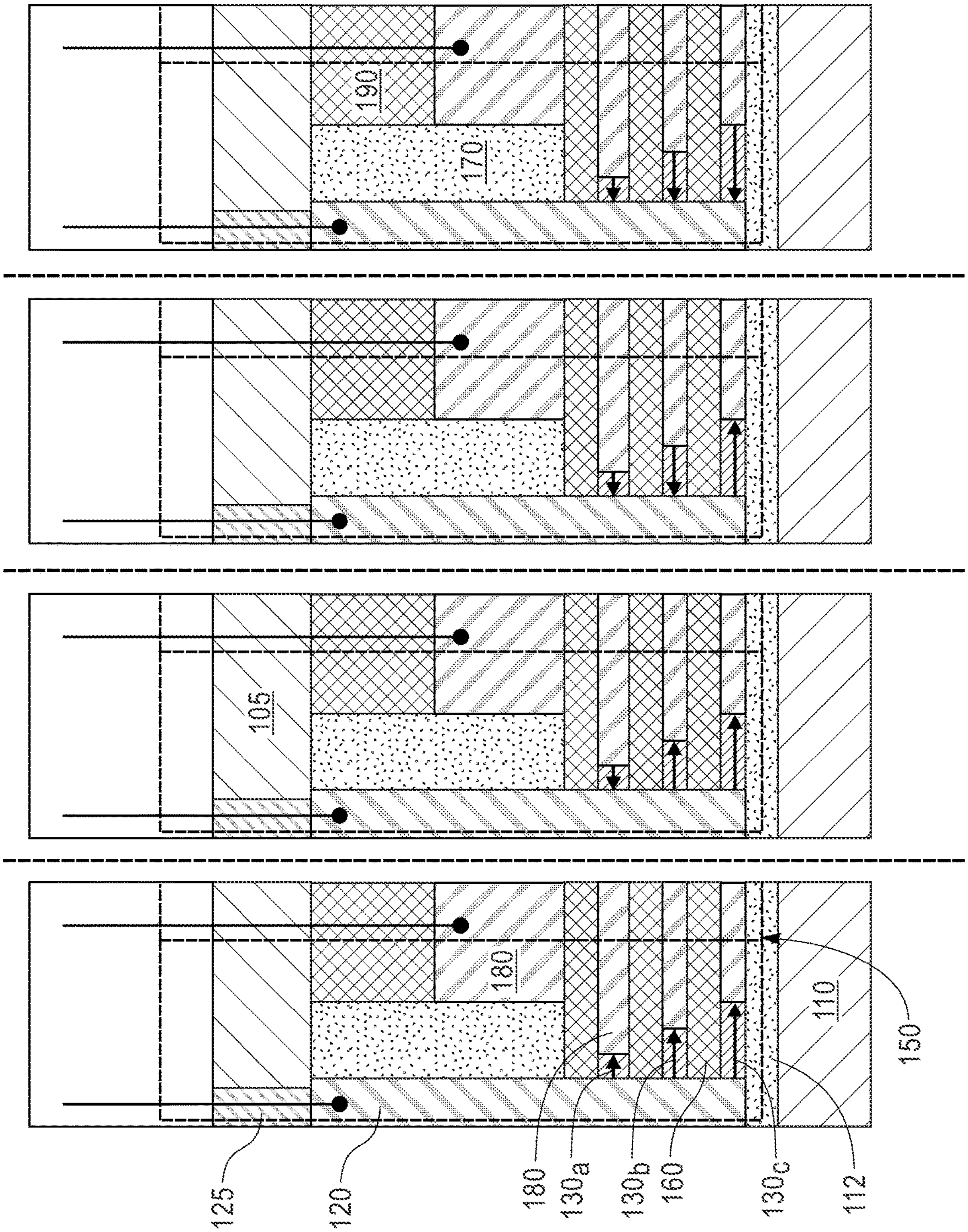
FIGS. 2A-2D are partial views of the memory device of FIG. 1, shown in a series of states, consistent with embodiments of the present disclosure.
Figures 7A, 7B, 7C, 7D:
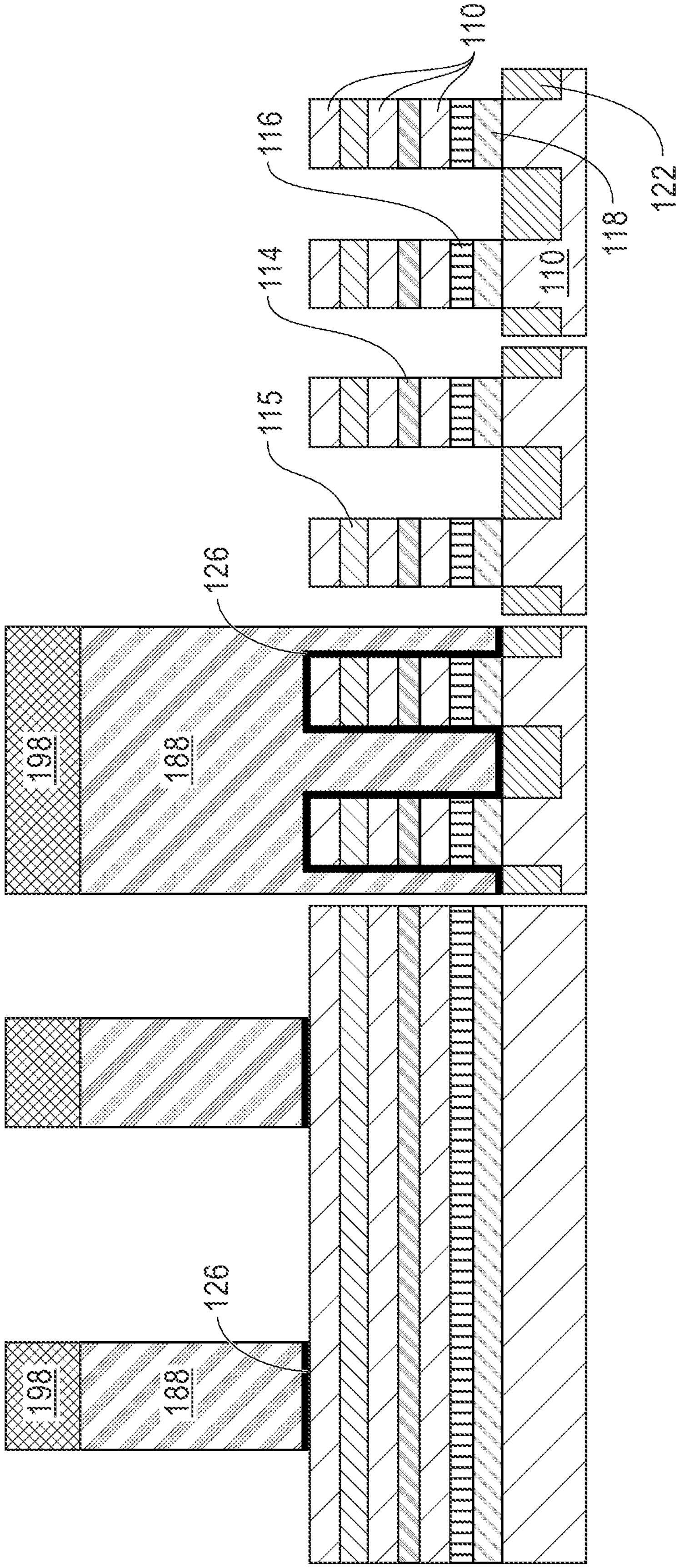
FIGS. 7A-7D show views of forming a dummy oxide layer and a placeholder for an electrode region, according to an embodiment.

FIG. 2A shows an example state 0 where $V_{BL}$=0V. At state 0, the direction of the polarization in the ferroelectric layers exhibit the same orientation (as indicated by the arrows in capacitors 130), after a reset of the memory cell for example. "State 0" maybe a starting state. In FIG. 2B, voltage is applied in state 1 ($V=V_1$). V1 creates an applied electric field sufficient to trigger a polarization reversal in the first capacitor 130*a* because it is above the threshold electric field of the ferroelectric material. The ferroelectric field in the first capacitor 130*a* flips. Since the threshold electric field for the other two capacitors (130*b* and 130*c*) has not been reached, their intrinsic polarization remains unchanged. This polarization configuration defines "State 1". FIG. 2C shows voltage increased to $V_2$ such that $V_2>V_1$. Voltage $V_2$ creates an applied electric field sufficient to trigger a polarization reversal in the second capacitor 130*b* because it is above the threshold electric field of the ferroelectric material. This polarization configuration defines "State 2". Since the threshold electric field for the third capacitors 130*c* has not been reached, its intrinsic polarization remains unchanged. FIG. 2D shows the voltage increased to $V_3$, such that $V_3>V_2>V_1$, which creates an applied electric field sufficient to trigger a polarization reversal in the third capacitor 130*c* because it is above the threshold electric field of the ferroelectric material. As can be seen, the direction of the polarization for all three capacitors 130*a*, 130*b*, and 130*c* have flipped for all three capacitors. This polarization configuration defines "State 3". In programming the device, a read function may read the net field coming from the different states of the capacitors 130. One may program the memory cell using a step function of applied voltages calibrated to provide incremental control of each individual capacitor in the memory cell. Accordingly, the structure provides a number of memory states greater than two making it a multi-state memory cell.

As will be appreciated, while the construction costs of a FRAM may be similar to that of a DRAM, FRAM has some advantages over the DRAM. For example, the ferroelectric material is non-volatile so that information is not lost when power is turned off from the device. In addition, the programming time for a FRAM is shorter than other devices including DRAMs. FRAMs are more power efficient. The advantages make FRAMs an alternative option to flash based devices.

Example Methodology of Manufacture

Reference is now made beginning at FIG. 3 to describe, by illustration, a method for manufacturing a stacked, multi-state ferroelectric RAM device. FIGS. 4A-4D through 19A-19D, show a fabrication process including additive and subtractive processes to form some circuit elements in the end device. The additive and subtractive processes involved (for example, masking, depositing, etching, lithography, etc.,) may be known to those of skill in the art and will not necessarily be identified in each act shown. The fabrication of the devices described herein can comprise multi-step sequences of, for example, photolithographic and/or chemical processing steps that facilitate gradual creation of electronic-based systems, devices, components, and/or circuits in a semiconducting and/or a superconducting device (e.g., an integrated circuit). For instance, a device can be fabricated on one or more substrates (e.g., a silicon (Si) substrates, and/or another substrate) by employing techniques including, but not limited to: photolithography, microlithography, nanolithography, nanoimprint lithography, photomasking techniques, patterning techniques, photoresist techniques (e.g., positive-tone photoresist, negative-tone photoresist, hybrid-tone photoresist, and/or another photoresist technique), etching techniques (e.g., reactive ion etching (RIE), dry etching, wet etching, ion beam etching, plasma etching, laser ablation, and/or another etching technique), evaporation techniques, sputtering techniques, plasma ashing techniques, thermal treatments (e.g., rapid thermal anneal, furnace anneals, thermal oxidation, and/or another thermal treatment), chemical vapor deposition (CVD), atomic layer deposition (ALD), physical vapor deposition (PVD), molecular beam epitaxy (MBE), electrochemical deposition (ECD), chemical-mechanical planarization (CMP), back-grinding techniques, and/or another technique for fabricating an integrated circuit. In some figures, some reference numerals for elements not being affected by a step may not be repeated.

The following figures are shown along four perspectives: one from the cross-electrode perspective over a fin (X axis), one from the cross-fin perspective (Y1 axis), one from the cross-fin perspective of a spacer (Y2 axis), and one from the cross-fin perspective of a second electrode (Y3 axis). FIG. 3 shows a legend providing the axes of a perspective view. FIGS. 4A/4B/4C/4D through 19A/19B/19C/19D should be viewed with constant reference back to FIG. 3 recalling the perspective view being displayed. Otherwise, one may recall that each "A" figure is shown along the perspective of the X axis, each "B" figure is shown along the perspective of the Y1 axis, each "C" figure is shown along the perspective of the Y2 axis, and each "D" figure is shown along the perspective of the Y3 axis.

Referring now to FIGS. 4A-4D as an initial part of the process, a substrate 110 is shown that is used to form the base of the device during fabrication. The substrate 110 may usually be a semiconductor including for example, silicon. FIGS. 5A-5D show formation of a nanosheet stack using an epitaxial growth process to form alternating layers of two different material types over the substrate 110. The two different material types may include suspension material layers 114, 115, and 116 formed between sacrificial layers of silicon 110. The suspension material layers 114, 115, and 116 will be placeholders for stacked electrodes 180 (See FIG. 1) forming part of the ferroelectric capacitors in the end device. The sacrificial layers of silicon 110 will be replaced with a dielectric mandrel.

The suspension layers 114, 115, and 116 may be composed of silicon germanium with different Ge concentration. The concentration of germanium in a suspension layer will determine the eventual thickness of the ferroelectric capacitor and width of the first electrode in that particular layer. In one embodiment, the suspension layers may be arranged with descending concentrations of germanium so that the end result electrodes 180 will be widest at the topmost electrode and shortest at the bottom-most electrode. (See again at FIG. 1 for the end result electrode structure in the capacitor area which shows electrodes of decreasing width from top to bottom).

The bottom-most layer 118 may be a sacrificial layer that has the most germanium concentration (for example, 75%) and may be grown directly onto the substrate 110. Layer 118 may be a placeholder for a bottom isolation layer formation described further below. Suspension layer 116 may be grown directly on top of layer 118. The suspension layer 116 may have the next highest germanium concentration (45%). A sacrificial layer of silicon 110 may be grown on top of layer 116 and suspension layer 114 may be grown on the sacrificial layer of silicon. The suspension layer 114 may have a germanium concentration of 30%. A sacrificial layer of silicon 110 may be grown on suspension layer 114. Suspension layer 115 may be grown on the sacrificial layer 110. The suspension layer 115 may have a germanium concentration of 15%. Another sacrificial layer of silicon 110 may be grown over the suspension layer 115. While three suspension layers (114, 115, and 116) and three sacrificial layers of silicon were shown, it will be understood that more layers (or less in some embodiments) may be included. In addition, while germanium concentration for the suspension layers were shown in descending concentration, arrangements may use ascending concentrations to form electrodes with smaller widths at top and larger widths at the bottom. In addition, the concentration amounts of germanium may differ depending on the desired end width for the electrode.

FIGS. 6A-6D show formation of fins and deposition of a shallow trench isolation (STI) layer 112. A hard mask (not shown) may be used to pattern the fin and trench structures. The STI layer 112 material may be used to backfill the etched-out portions of the substrate 110 in between fins. In some embodiments, the top edge of the STI layer 112 is aligned with or below the bottom-most surface of the sacrificial layer 118.

FIGS. 7A-7D show formation of a dummy oxide layer 126 and a dummy electrode placeholder material 188. The dummy oxide layer 126 may be deposited conformally on the fin structures. The dummy electrode placeholder material 188 may be deposited and planarized on top of the dummy oxide layer 126. The dummy electrode placeholder material 188 may be for example, an amorphous or polycrystalline silicon. A hard mask 198 may be placed over the dummy electrode placeholder material 188 and dummy oxide layer 126. The resulting pattern is transferred down to the dummy electrode placeholder material 188 and dummy oxide layer 126 providing the resulting structure shown.

Figures 8A, 8B, 8C, 8D:
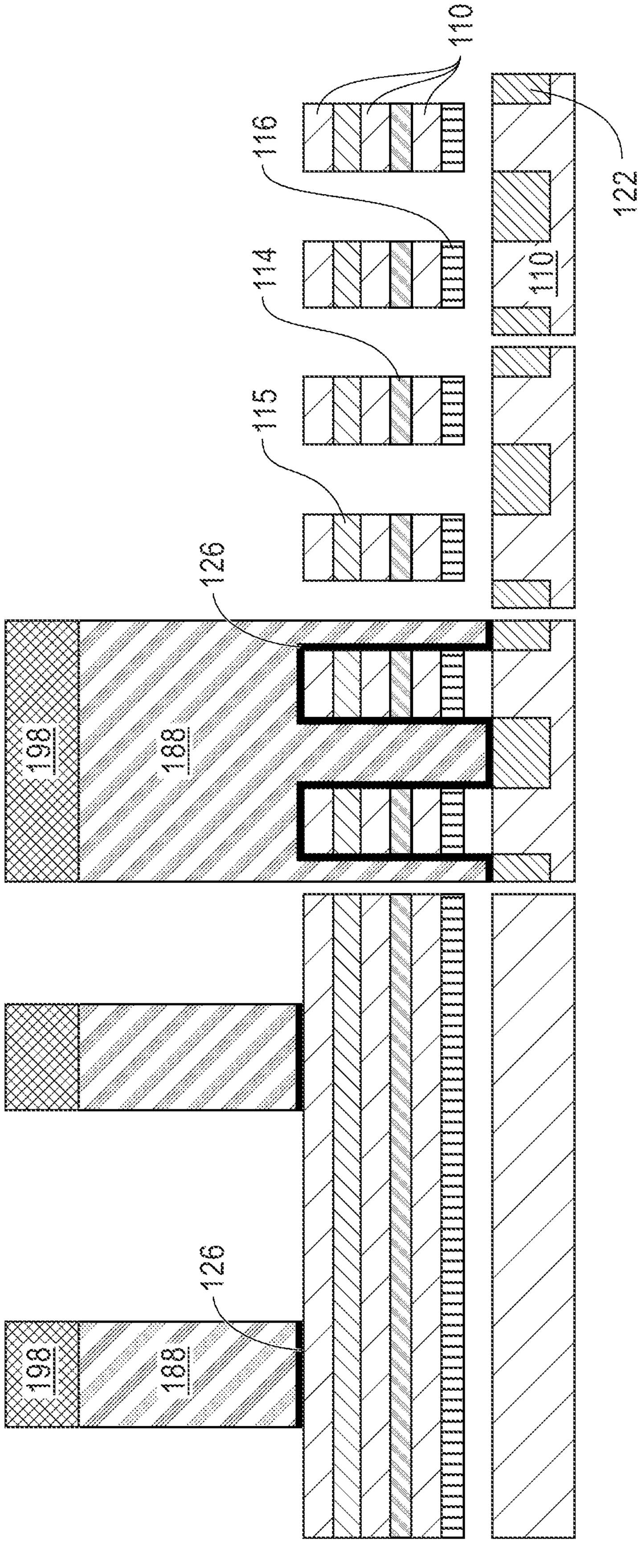
FIGS. 8A-8D show views of selective removal of an isolation placeholder layer according to an embodiment.
Figures 9A, 9B, 9C, 9D:
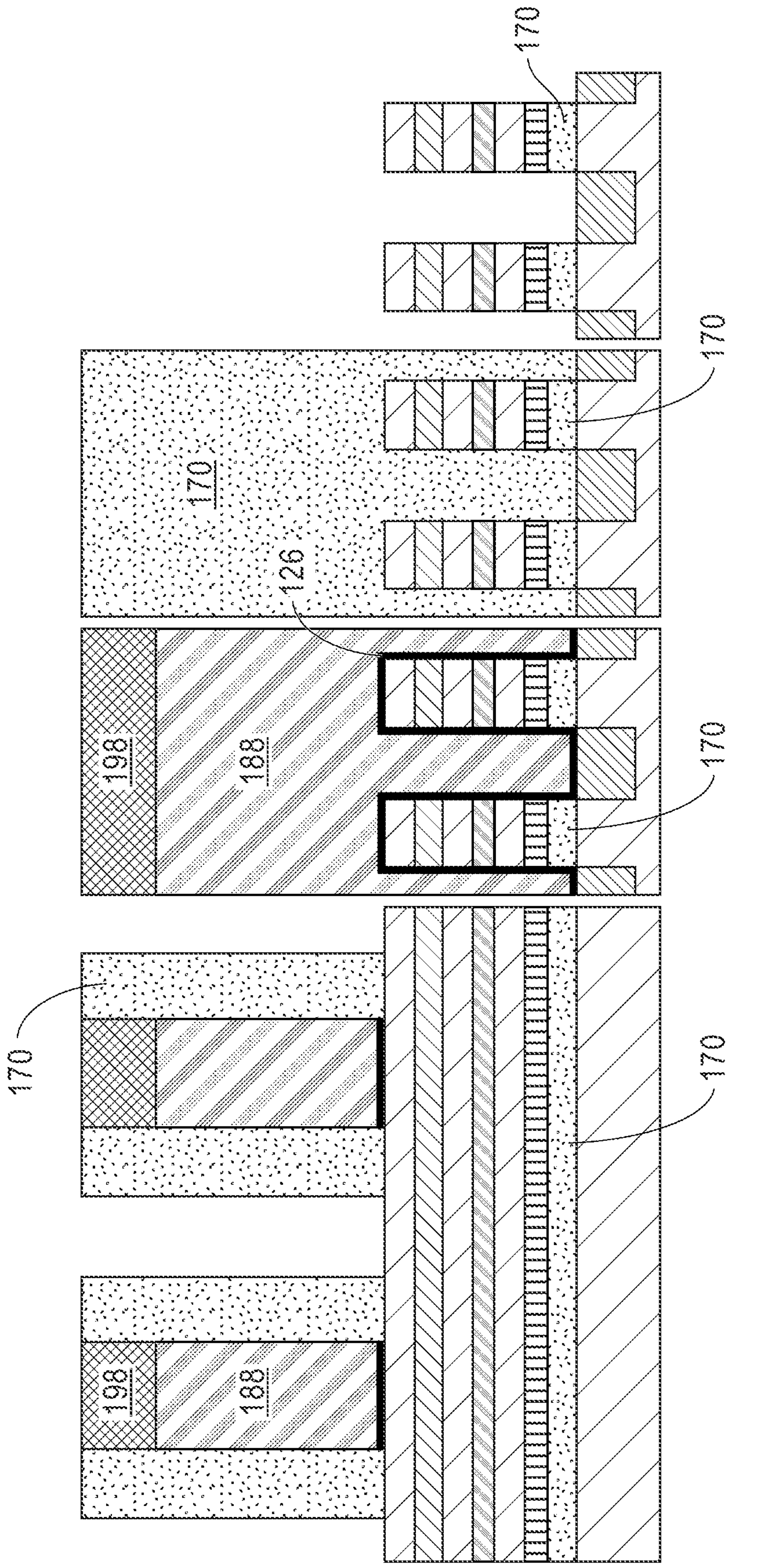
FIGS. 9A-9D show views forming electrode spacers and an isolation layer, according to an embodiment.

FIGS. 8A-8D show the selective removal of the sacrificial layer 118. Removal may be performed by conformal dry or wet etching techniques including, for example, dry vapor phase etching. FIG. 8B shows the surrounding supporting structure after the layer 118 is removed (in comparison to the other views which may appear as though the overlying stacks are floating).

FIGS. 9A-9D show a conformal deposition of a low-k dielectric 170. The dielectric material 170 may cover the sides of the fins, dummy electrodes and may fill the space left behind by the removal of the sacrificial layer 118. The layer of dielectric material 170 in between the substrate 110 and the suspension layer 116 may serves as a bottom isolation layer insulating the ferroelectric memory cells from the substrate 110. The layer of dielectric material 170 on the sides of the dummy electrodes serves as an electrically insulating spacer between adjacent first and second electrodes. The electrodes spacer are formed by performing an anisotropic etch back to remove the dielectric material from the horizontal planes after conformal deposition of dielectric material 170 including for example, the top of the dummy electrodes (which exposes the hard mask layer 198) and the trench areas on the sides of and in between the fins.

Figures 10A, 10B, 10C, 10D:
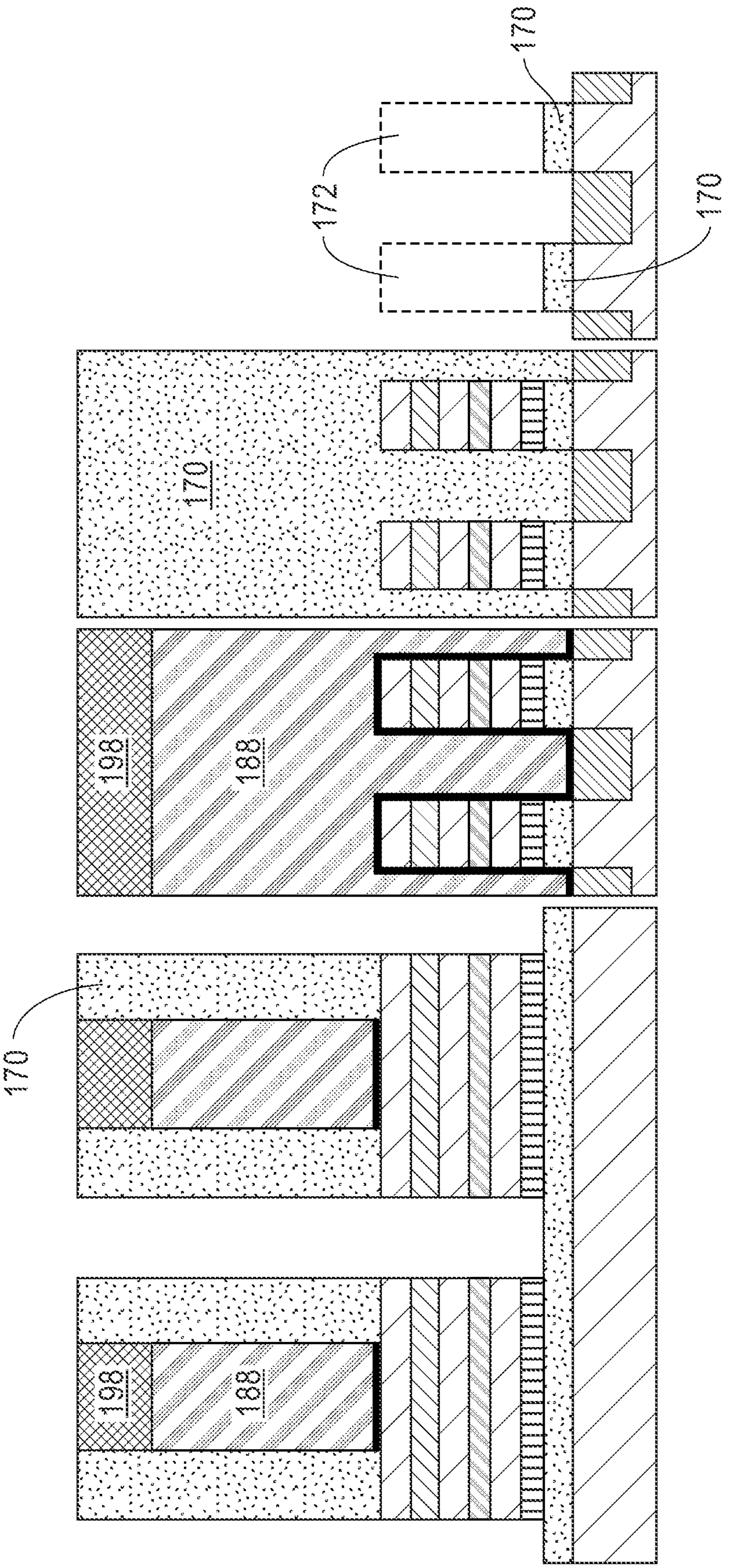
FIGS. 10A-10D show views of forming trench areas between fins, according to an embodiment.
Figures 11A, 11B, 11C, 11D:
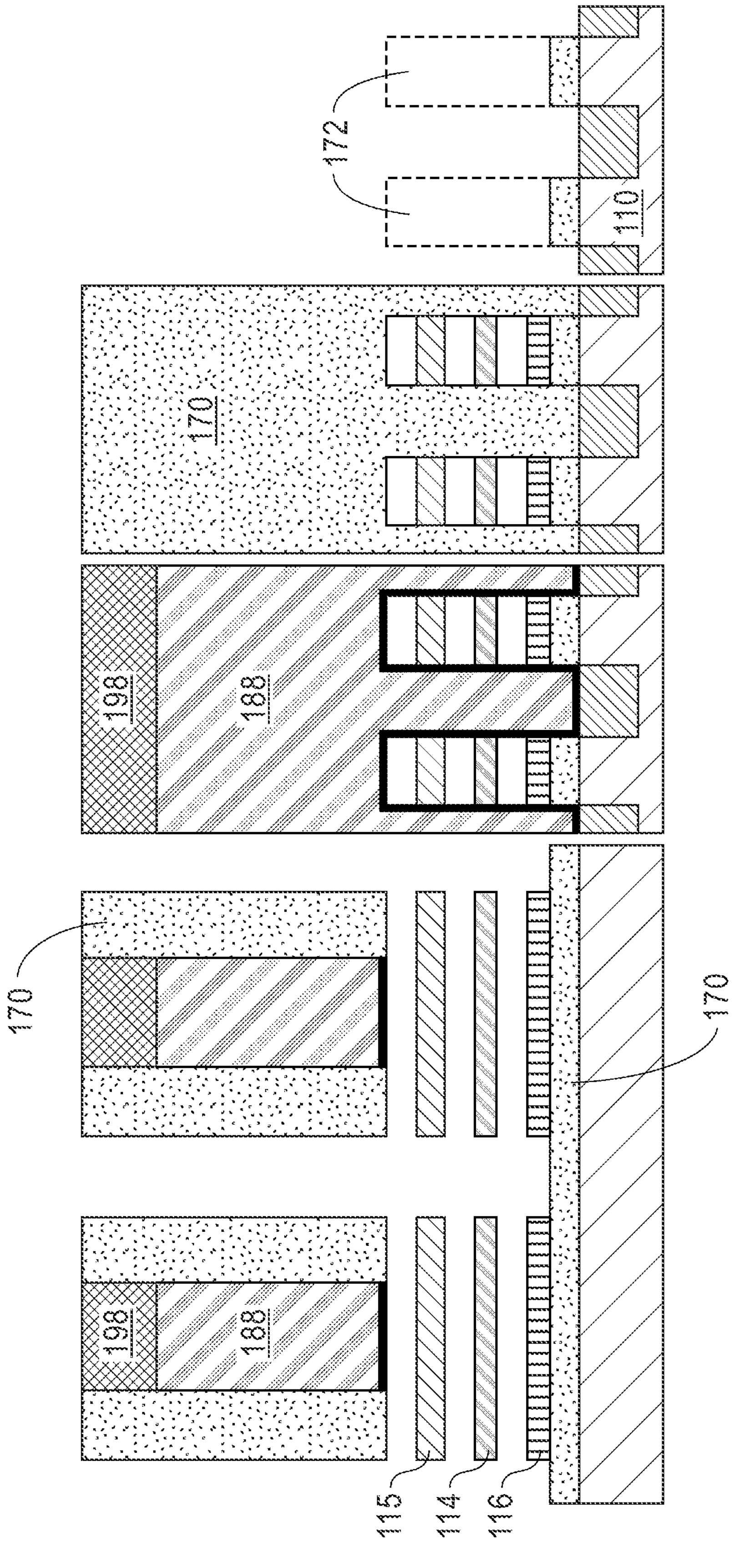
Figures 12A, 12B, 12C, 12D:
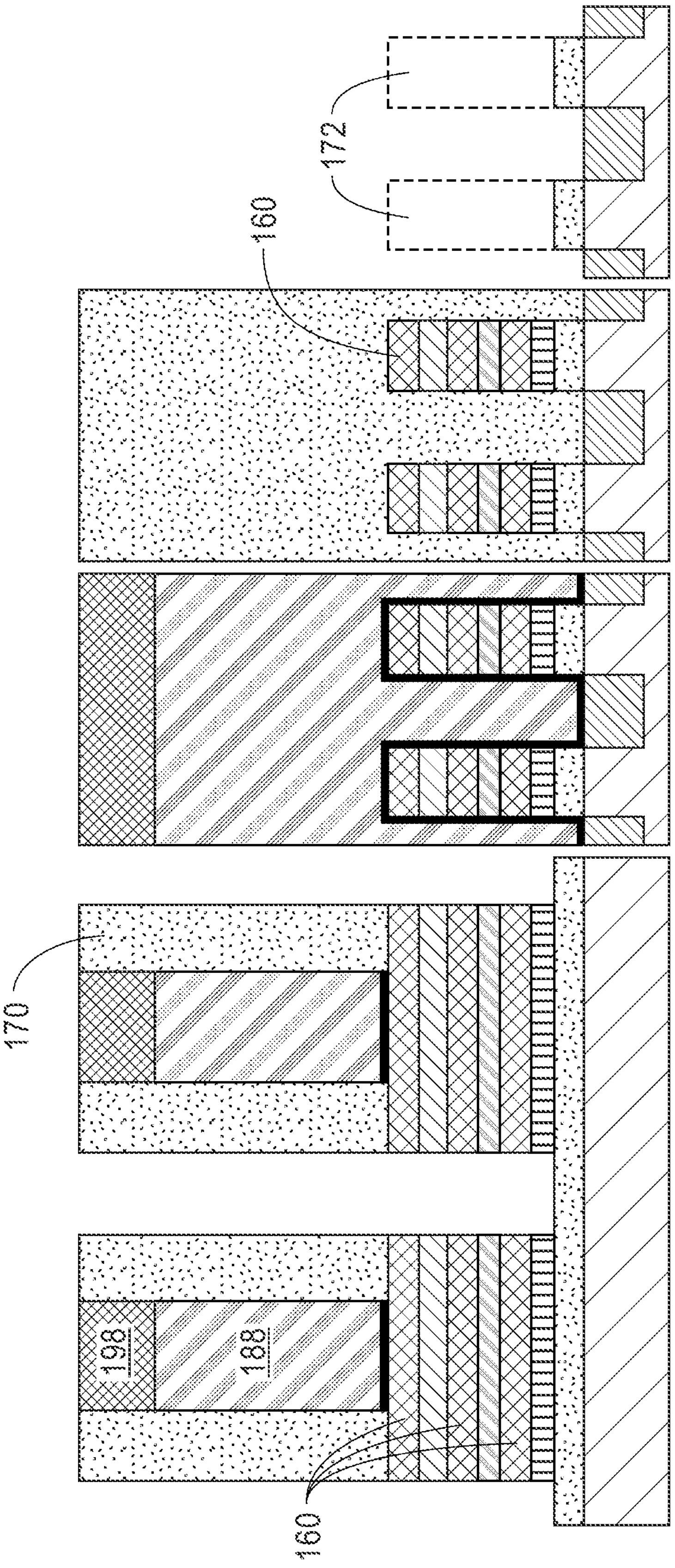
FIGS. 12A-12D show views depositing silicon nitride into empty spaces isolating one ferroelectric layer from another ferroelectric layer, according to an embodiment.
Figures 13A, 13B, 13C, 13D:
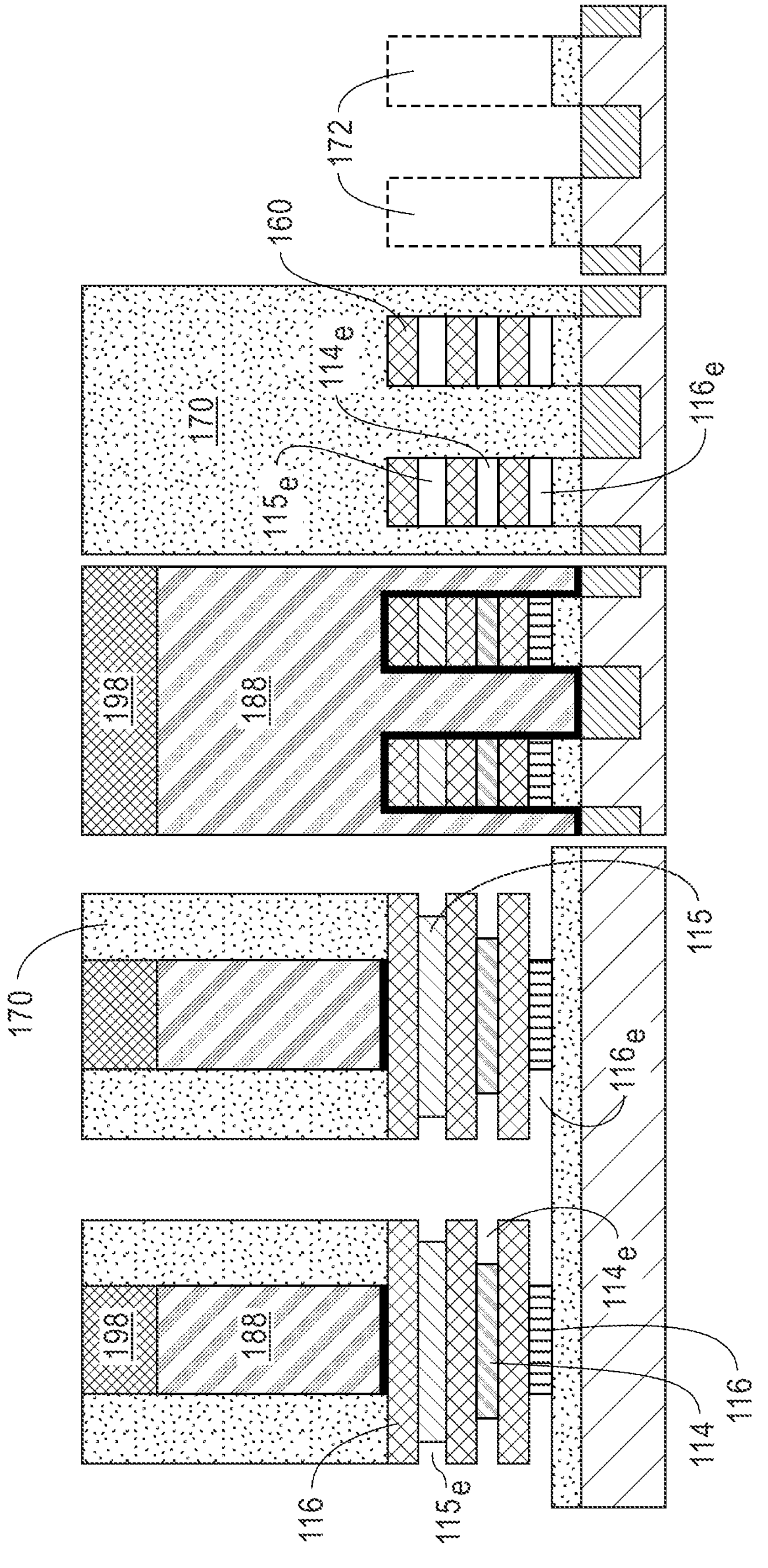
FIGS. 13A-13D show views of indenting a suspension material, according to an embodiment.
Figures 14A, 14B, 14C, 14D:
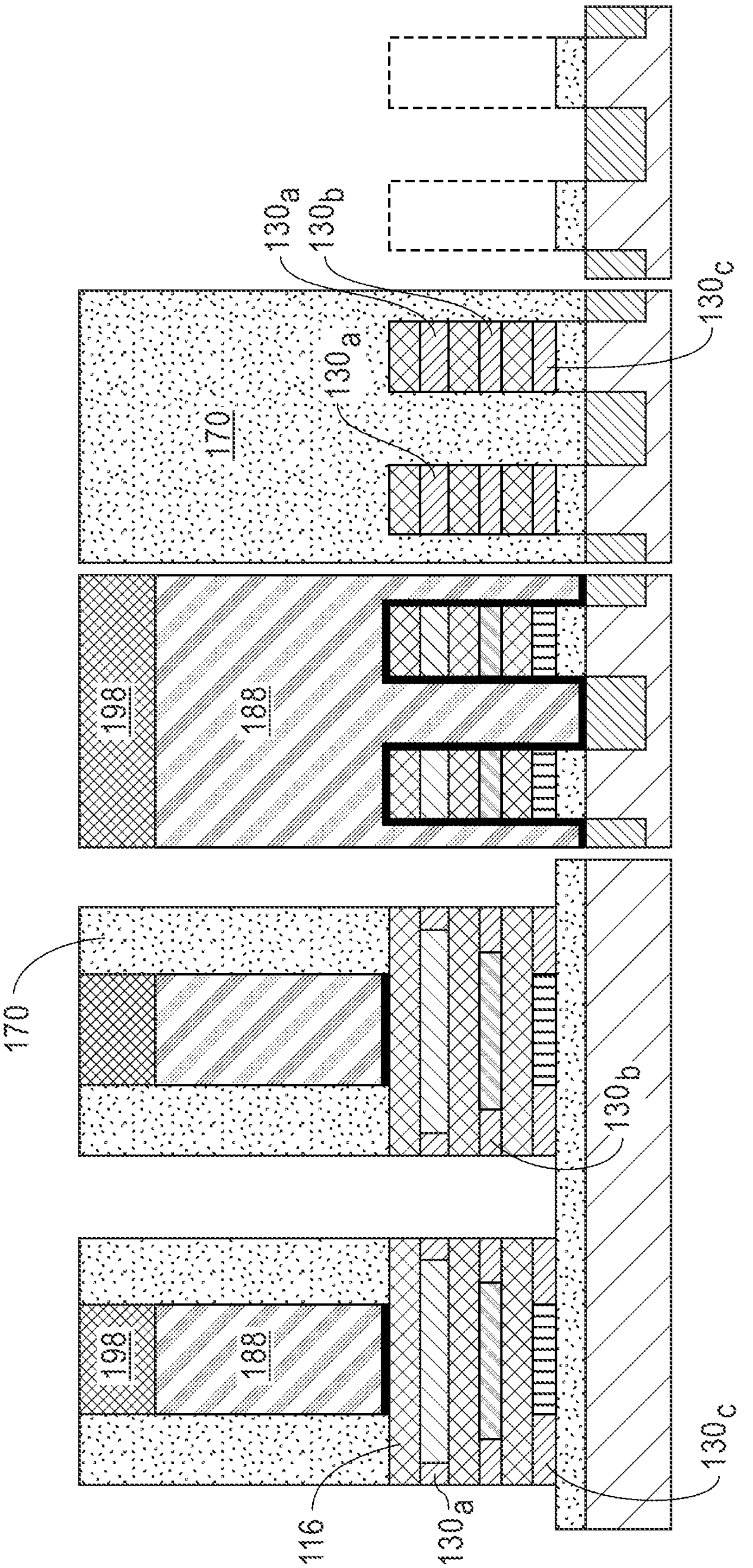
FIGS. 14A-14D show views forming ferroelectric contact plates in the recesses of FIGS. 13A-13D, according to an embodiment.
Figure 15A:
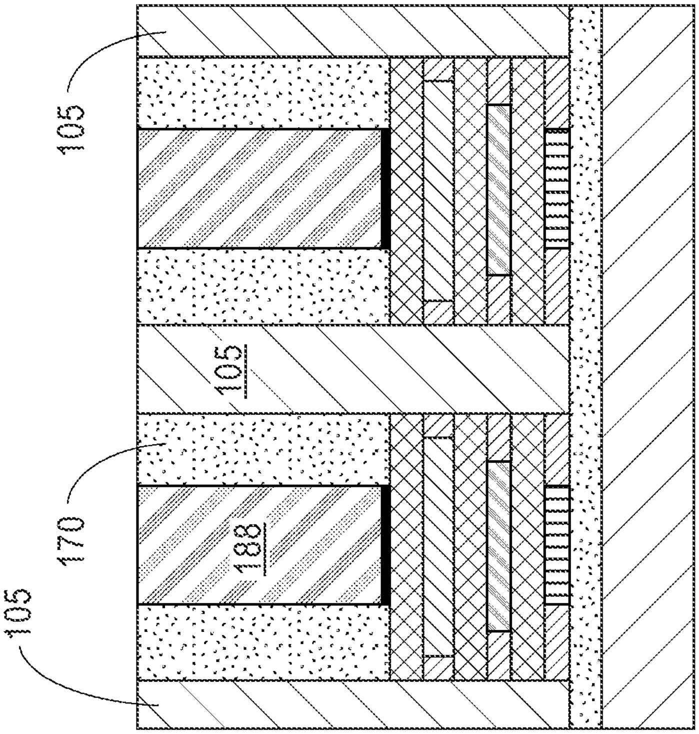
FIGS. 15A-15D show views of filling spaces with an inter-layer dielectric followed by planarization, according to an embodiment.
Figure 15B:
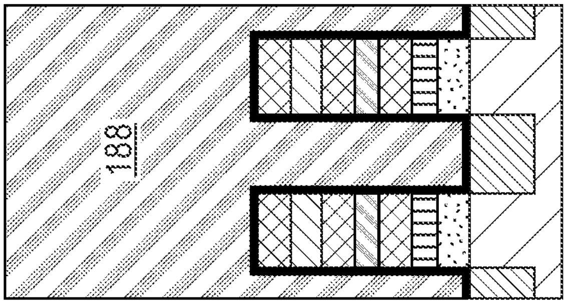
Figure 15C:
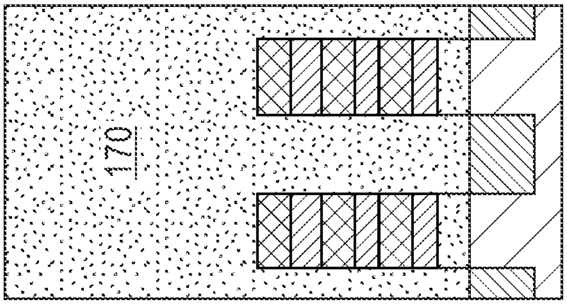
Figure 15D:
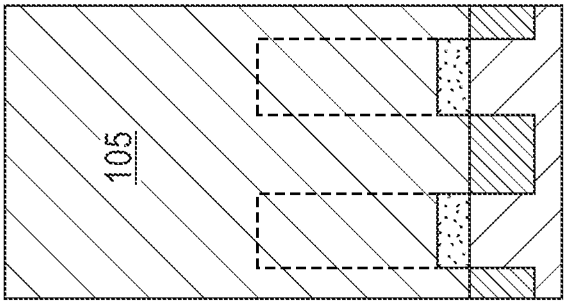
Figures 16A, 16B, 16C, 16D:
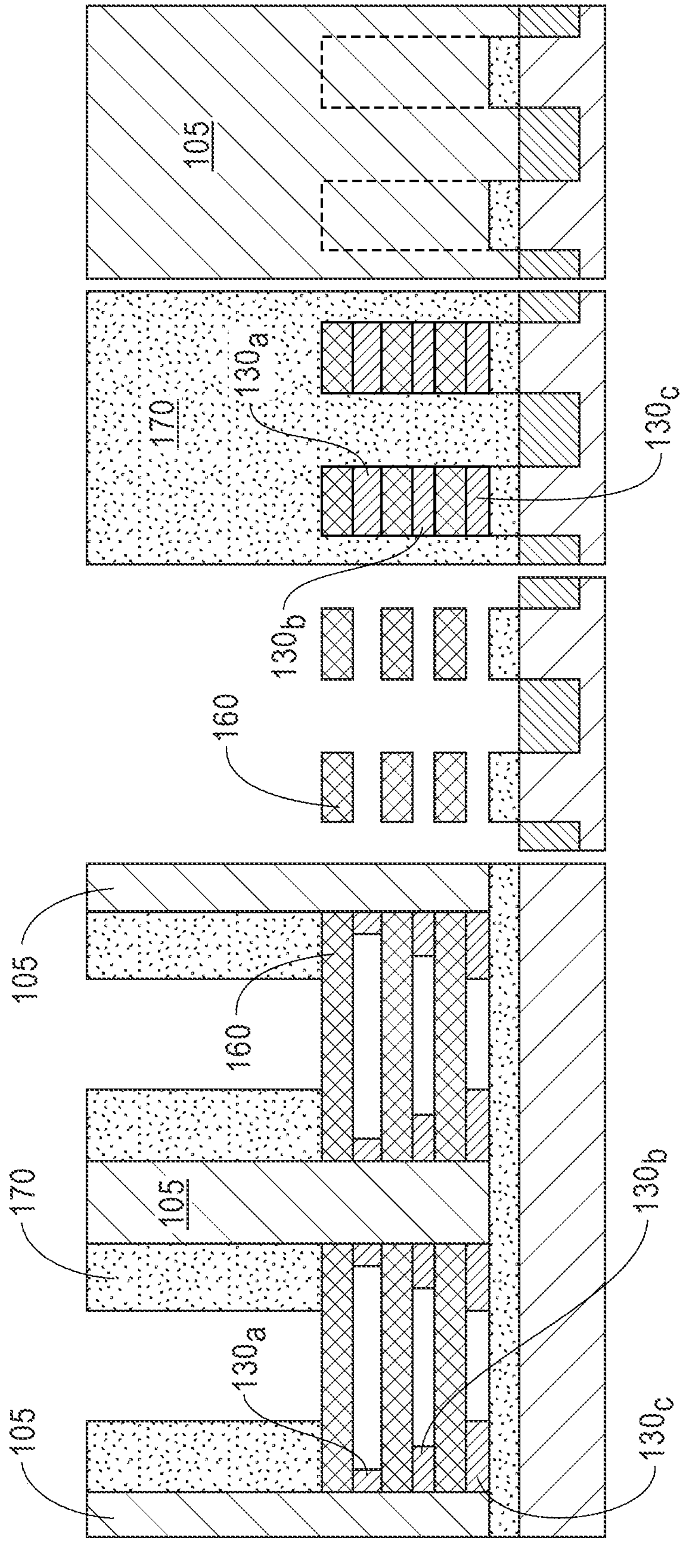
FIGS. 16A-16D show views of selectively removing the dummy electrode and suspension layers, according to an embodiment.
Figures 17A, 17B, 17C, 17D:
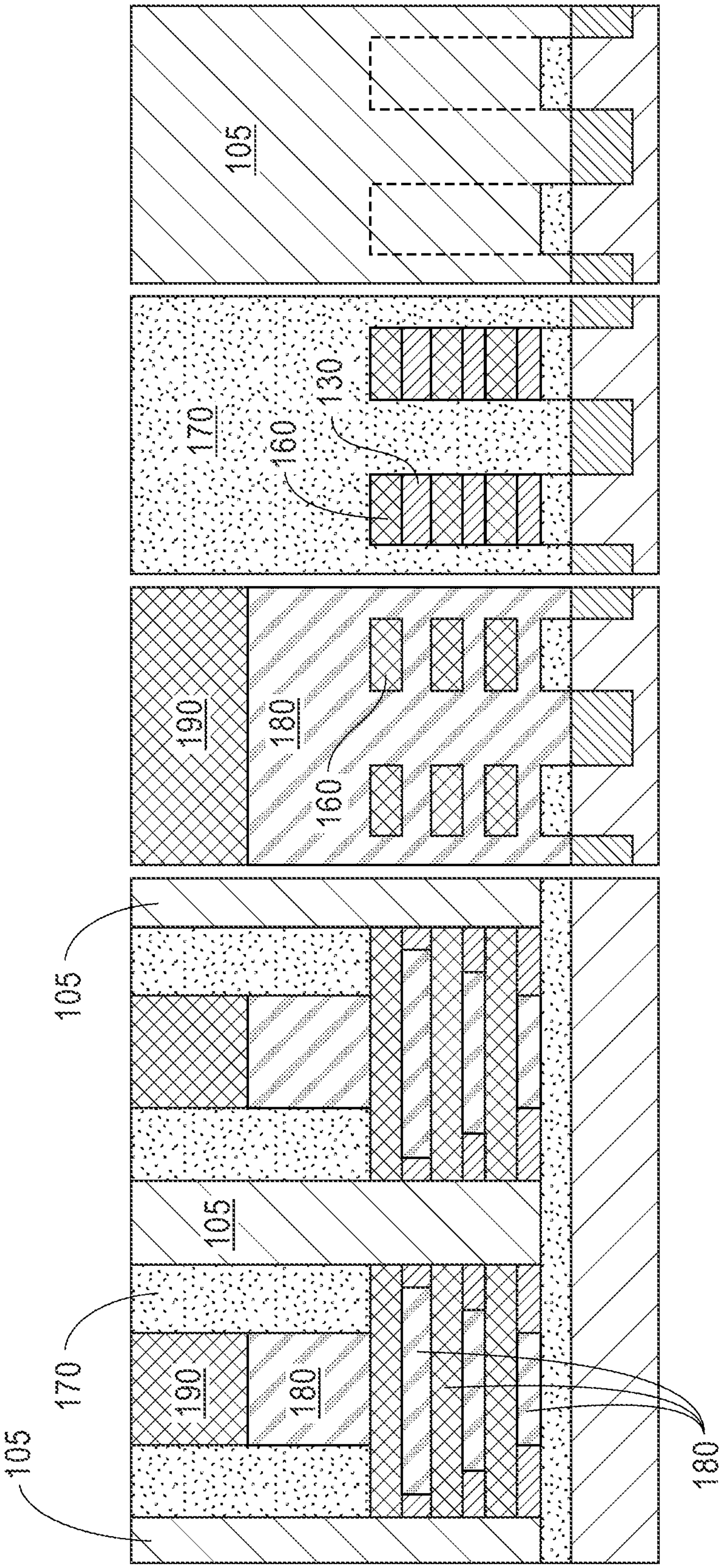
FIGS. 17A-17D show views of forming first electrodes in the electrode region and in the areas of removed suspension layers, according to an embodiment.
Figures 18A, 18B, 18C, 18D:
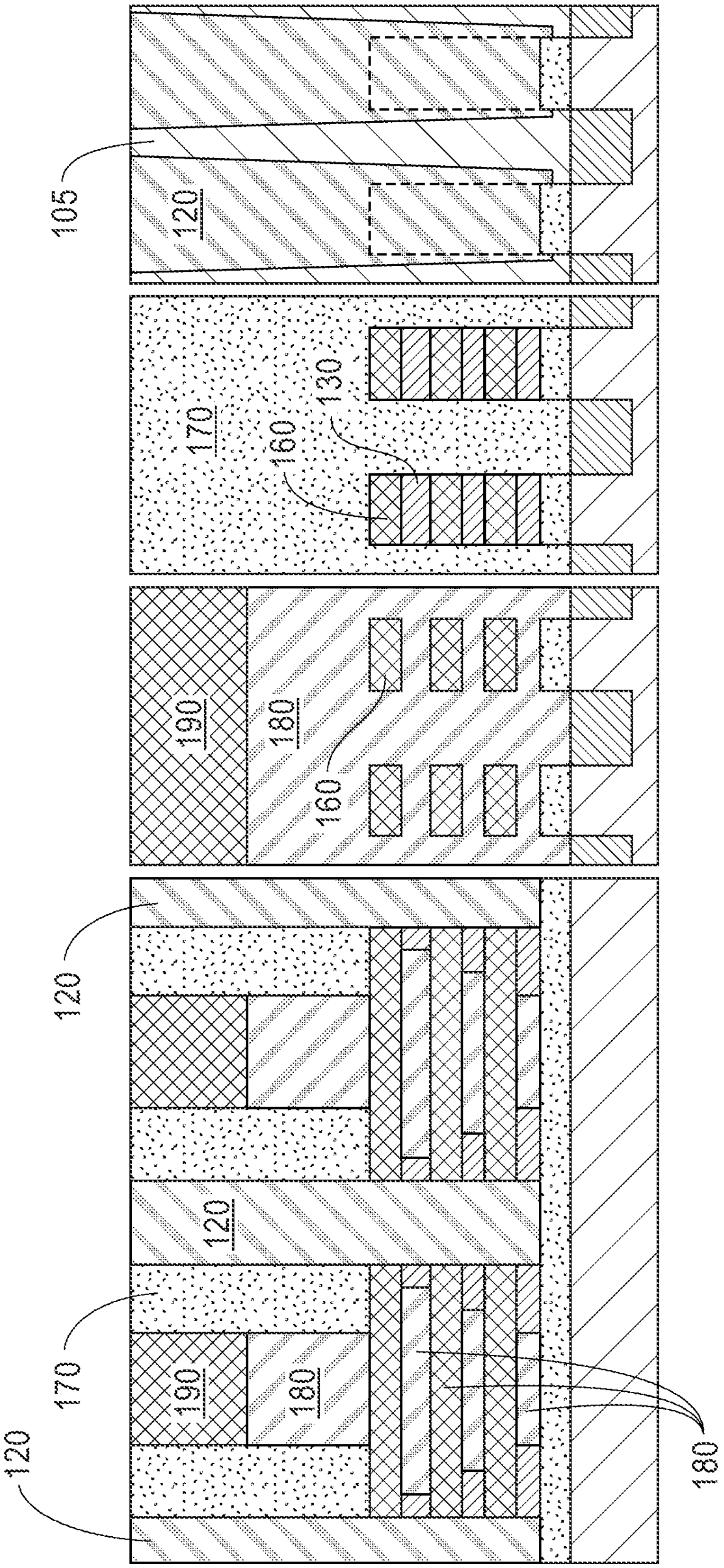
FIGS. 18A-18D show views of forming second electrodes in contact with outer surfaces of the ferroelectric plates, according to an embodiment.
Figures 19A, 19B, 19C, 19D:
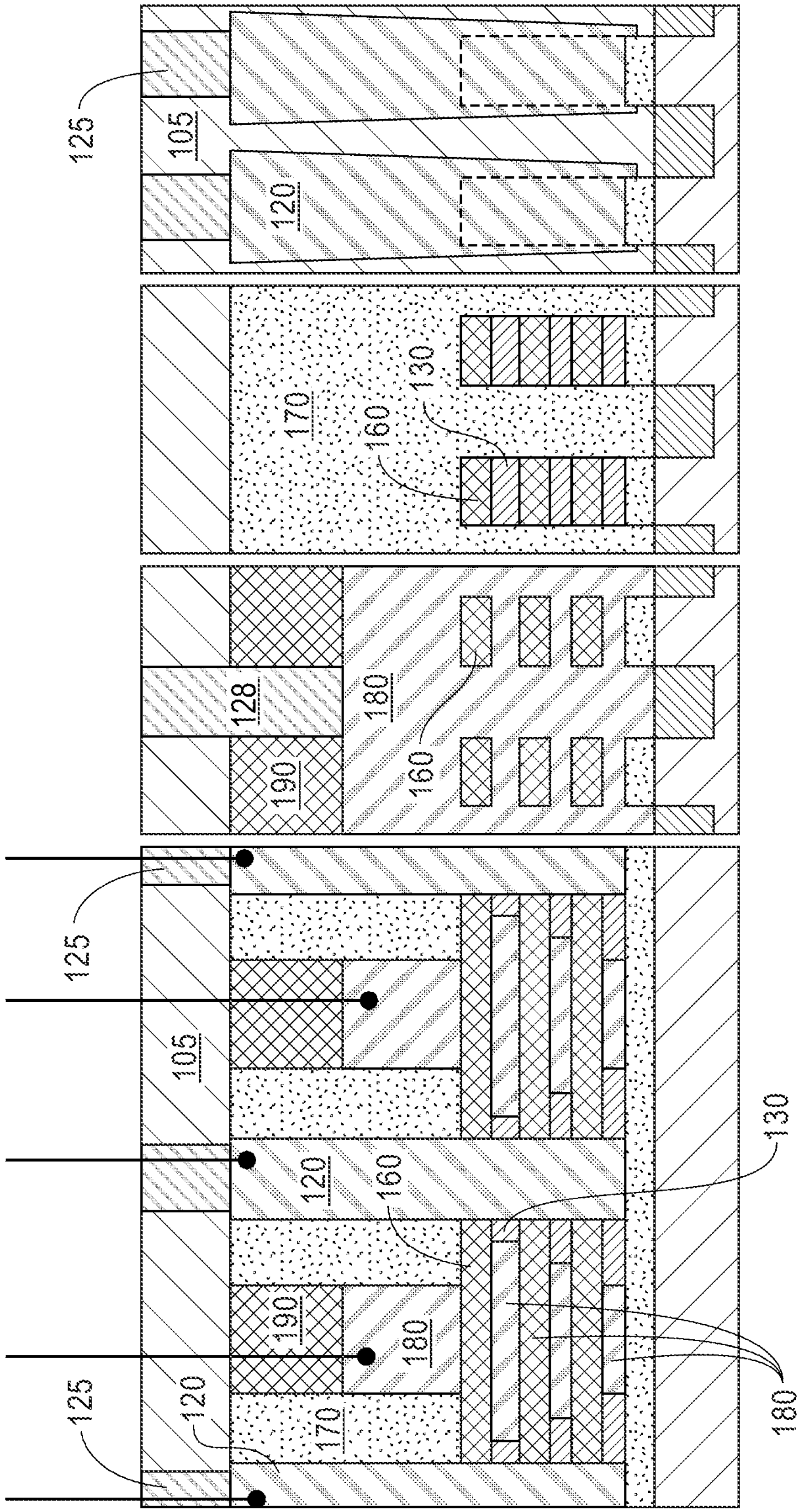
FIGS. 19A-19D show views forming middle of line metal contacts, according to an embodiment.

FIGS. 10A-10D show performance of an anisotropic directional fin recess process. Referring specifically to FIG. 10A, material in the stack of alternating layers is recessed down to the isolation layer of material 170, which lengthens the trench between fin structures. FIG. 10D represents a stack projection 172 of the fin in the dummy electrode region that has not been removed by the recess process. FIG. 10C shows the fin in the electrode spacer region.

FIGS. 11A-11D show selective removal of sacrificial layers of silicon 110. Removal of the targeted silicon may be performed by any number of known commercial conformal etching processes. The dummy oxide layer 126 protects the dummy electrode (amorphous silicon) during the etching process in suspension regions 114, 115, and 116.

FIGS. 12A-12D show formation of the dielectric mandrel in the ferroelectric capacitor region. In one embodiment, a conformal deposition of a dielectric 160 (for example, silicon nitride) is used to coat all the exposed surfaces, which includes the dielectric material 160 filling the empty spaces left behind from the removal of silicon shown in FIGS. 11A-11D. An isotropic etch back process may be used to etch back the excess dielectric material 160 from the areas outside of the mandrel location. FIGS. 12A-12D show the result after the etch back process.

FIGS. 13A-13D show selective indentation of the suspension layers 114, 115, and 116. An isotropic dry or wet etching process may be used to remove portions of the suspension layer materials from the outside, inward. Since the suspension layers 114, 115, and 116 have different concentration of germanium, the chemical etch rate will be different for each layer. For example, depending on the etchant used, the higher concentrations of germanium may etch back faster than lower concentrations. Since all layers may be exposed simultaneously, the process will remove more material from some suspension layers than other layers during the exposure time. The amount removed (or the end width for a layer) may be controlled by the exposure time applied to the layers. The spaces defining the indenting for each suspension layer are called out as capacitor cavities 114*e*, 115*e*, and 116*e* (using the same numbering associated with respective layers). The depths of the capacitor cavities in each respective suspension layers may be chosen based on a desired capacitance contribution and electrical parameters (for example, programming voltage) for multi-state memory cell operation.

FIGS. 14A-14D show formation of capacitors (referenced generally as "130 in FIG. 1) in the mandrel. The formation includes conformal deposition of a ferroelectric material into the recesses 114*e*, 115*e*, and 116*e* followed by an isotropic etch back. Capacitor 130*a* is in contact with the ends of suspension layer 115. Capacitor 130*b* is in contact with the ends of suspension layer 114. Capacitor 130*c* is in contact with the ends of suspension layer 116. In one embodiment, the ferroelectric material may be deposited using a conformal deposition technique after which, an isotropic etch process removes the excess material from the rest of the device structure. As can be seen from FIG. 14A, the ferroelectric material forms two plates, one on each side of the respective suspension layers 114, 115, and 116. The plates at each layer are separated by a different distance than plates on another level, creating a different capacitance at each level of the mandrel.

FIGS. 15A-15D show deposition of an inter-layer dielectric 105 (for example, an oxide) into the trench between fins and around the side of the fins. Some embodiments may include planarization that removes material from the top of the structure (including for example the hard mask pattern 198 and some of the dielectric 170), down to the shallow trench isolation 122.

FIGS. 16A-16D show a sequential etch of the materials. The sequence may include removal of the dummy electrode material 188. The dummy oxide layer 126 may be removed. Once the dummy oxide layer 126 is removed, the suspension layers 114, 115, and 116 may be removed (leaving cavities in the absence of the suspension materials).

FIGS. 17A-17D show formation of first electrodes. Metal material may be deposited into the empty region left behind from the removal of the dummy electrode material and into the cavities formed from removal of the suspension layers 114, 115, 116. The metal wraps around the mandrel area (shown best in FIG. 17B). The metal material regions define a first electrode 180. The metal material makes contact with each of the capacitors 130. Planarization may be used to level off the electrode 180 in the electrode area. Some embodiments recess the metal in the electrode area down and form a dielectric cap 190 over the first electrode 180. The dielectric cap 190 isolates the electrode 180 and protects against the possibility of an electrical short when forming the adjacent second electrode.

FIGS. 18A-18D show formation of a second electrodes. Metal material, that may be the same material used in the first electrode, is deposited to form second electrodes 120. The second electrode 120 may be formed in the trench and on the sides of the mandrel so that the metal is in contact with the outside surfaces of the capacitors 130. The trench positioned second electrode 120 may be shared by adjacent capacitors 130 of different mandrels. The shape of the second electrode 120 may be determined by patterned etching (a result of which can be seen for example, in FIG. 18D). As maybe appreciated, the result shown in FIGS. 18A-18D provide multi-state memory cells each including stacked ferroelectric capacitors 130 of variable thickness.

FIGS. 19A-19D show formation of middle of the line contacts. A blanket inter-layer dielectric 105 may be deposited over the memory cell structures. Patterning may be used to position metal contacts 125 onto the second electrodes 120. Electrical contacts 128 contact the first electrode 180 through inter-layer dielectric 105 and dielectric cap 190 and are formed in a different plan from metal contacts 125.

Conclusion

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits, and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A memory device, comprising:
- a substrate;
- a plurality of vertically stacked ferroelectric capacitors formed on the substrate, wherein
  - a first ferroelectric capacitor of the plurality of vertically stacked ferroelectric capacitors has a capacitive output that is different from that of a second ferroelectric capacitor of the plurality of vertically stacked ferroelectric capacitors, in response to an applied constant voltage;
- a dielectric mandrel positioned between layers of the plurality of vertically stacked ferroelectric capacitors;
- a first electrode in electrical contact with the plurality of vertically stacked ferroelectric capacitors; and
- a second electrode in electrical contact with the plurality of vertically stacked ferroelectric capacitors.

2. The memory device of claim 1, further comprising:
- a first capacitor plate and a second capacitor plate in the first ferroelectric capacitor; and
- a third capacitor plate and a fourth capacitor plate in the second ferroelectric capacitor, wherein a distance between the first capacitor plate and the second capacitor plate is different from a distance between the third capacitor plate and the fourth capacitor plate.

3. The memory device of claim 2, wherein the distance between the first capacitor plate and the second capacitor plate is longer than the distance between the third capacitor plate and the fourth capacitor plate.

4. The memory device of claim 3, wherein the first ferroelectric capacitor is positioned on top of the second ferroelectric capacitor.

5. The memory device of claim 1, wherein the first electrode is wrapped around the dielectric mandrel and is in contact with a first surface of the plurality of vertically stacked ferroelectric capacitors.

6. The memory device of claim 5, wherein the second electrode is in contact with a second surface of the plurality of vertically stacked ferroelectric capacitors.

7. The memory device of claim 1, further comprising an isolation layer positioned on top of the substrate and under the plurality of vertically stacked ferroelectric capacitors.

8. The memory device of claim 7, wherein the isolation layer extends horizontally under the first electrode and under the second electrode.

9. The memory device of claim 1, further comprising a first capacitor plate in the first ferroelectric capacitor and a second capacitor plate in the second ferroelectric capacitor, wherein the first capacitor plate has a thickness that is different from a thickness of the second capacitor plate.

10. The memory device of claim 1, wherein the first ferroelectric capacitor has an applied threshold voltage for polarization reversal that is higher or lower than an applied threshold voltage of the second ferroelectric capacitor.

11. A programmable memory device, comprising:
- a plurality of ferroelectric capacitor plate pairs stacked in layers, wherein a thickness of a first capacitor plate pair of the plurality of ferroelectric capacitor plate pairs varies from a thickness of a second capacitor plate pair of the plurality of ferroelectric capacitor plate pairs;
- one or more isolation layers positioned between the plurality of ferroelectric capacitor plate pairs;
- a first electrode in contact with the plurality of ferroelectric capacitor plate pairs; and
- a second electrode in contact with the plurality of ferroelectric capacitor plate pairs.

12. The programmable memory device of claim 11, further comprising a dielectric mandrel positioned between the layers of the plurality of ferroelectric capacitor plate pairs.

13. The programmable memory device of claim 12, wherein the first electrode is wrapped around the dielectric mandrel and is in contact with a first surface of the plurality of ferroelectric capacitor plate pairs.

14. The programmable memory device of claim 13, wherein the second electrode is in contact with a second surface of the plurality of ferroelectric capacitor plate pairs.

15. The programmable memory device of claim 11, wherein a distance between the first capacitor plate pair is different from a distance between the second capacitor plate pair.

16. The programmable memory device of claim 15, wherein the distance between the first capacitor plate pair is longer than the distance between the second capacitor plate pair.

* * * * *